United States Patent
Tran

(10) Patent No.: US 8,327,206 B2
(45) Date of Patent: Dec. 4, 2012

(54) BLANKING PRIMITIVES MASKING CIRCUIT

(75) Inventor: Que T. Tran, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 398 days.

(21) Appl. No.: 12/771,261

(22) Filed: Apr. 30, 2010

(65) Prior Publication Data

US 2011/0154171 A1 Jun. 23, 2011

Related U.S. Application Data

(60) Provisional application No. 61/288,266, filed on Dec. 19, 2009.

(51) Int. Cl.
*G01R 31/28* (2006.01)

(52) U.S. Cl. .................. 714/731; 714/704; 714/798

(58) Field of Classification Search .................. 714/704, 714/707, 731, 744, 775, 789, 798, 819; 375/362, 375/363, 368

See application file for complete search history.

(56) References Cited

U.S. PATENT DOCUMENTS

| | | | |
|---|---|---|---|
| 5,212,690 A * | 5/1993 | Low | 370/514 |
| 7,366,803 B1 | 4/2008 | Gaither | |
| 8,065,597 B1 * | 11/2011 | Parulkar | 714/798 |

FOREIGN PATENT DOCUMENTS

EP  1674876 A1  6/2006

* cited by examiner

*Primary Examiner* — Scott Baderman
*Assistant Examiner* — Joseph Kudirka
(74) *Attorney, Agent, or Firm* — William K. Bucher

(57) ABSTRACT

A blanking primitive masking circuit has a detection and handling circuit that receives data containing blanking primitives. The detection and handling circuit generates a dynamic blanking signal when blanking primitives are detected. The received data is delayed and provided to a pattern detector that generates a synchronization signal provided to a memory and a phase sync signal provided to the detection and handling circuit and to a comparator. The comparator receives reference data from the memory, the delayed data, and the dynamic blanking signal. The comparator compares the reference data with the delayed data and generates bit error outputs from mismatched reference data bits and delayed data bits when the dynamic blanking signal from the detection and handling circuit is absent and suppressing the generation bit error outputs when the blanking primitive are in the delay data and the dynamic blanking signal is present.

12 Claims, 6 Drawing Sheets

| C | D | E | F |
|---|---|---|---|
| G | H | I | J |
| K | L | A | B |
| C | D | E | F |
| G | H | I | J |

40-BIT D-WORDS

40-BIT D-WORDS WITH BLANKING PRIMITIVES

US 8,327,206 B2

BLANKING PRIMITIVES MASKING CIRCUIT

CROSS-REFERENCE TO RELATED APPLICATIONS

This application claims priority under 35 U.S.C. §119(e) from U.S. Provisional Application Ser. No. 61/288,266, filed on Dec. 19, 2009 the contents of which are herein incorporated by reference in their entirety.

BACKGROUND OF THE INVENTION

Bit error detection plays an important role in receiver margin test solutions. In a receiver margin test solution, a high speed serial generator, such as Arbitrary Waveform Generators and the like, generates a high speed serial signal as an input to a Device Under Test (DUT). A test and measurement instrument, such as an oscilloscope or the like, having error detection can monitor the output of the DUT through a loop back mode, normally in a retimed loopback mode to detect any error from the receiver of the DUT. The input to the DUT is stressed by impairing the input signal of the DUT with jitter and a spread spectrum clock. (SSC)

SUMMARY OF THE INVENTION

Accordingly, the present invention is a blanking primitive masking circuit that detects and suppresses blanking primitives in serial data received from a device under test. The blanking primitive masking circuit is associated with a bit error detection circuit having input circuitry. The input circuitry converts the serial data having blanking primitives into parallel data having the blanking primitives and provides the parallel data to a detector. The parallel data is also coupled to a delay circuit which output delayed parallel data to a pattern detector and a comparator. The pattern detector receives a selected data pattern and generates a synchronization signal in response to the detection of the selected data pattern in the delayed parallel data and a phase sync signal representative of a phase difference between the delayed parallel data and the selected data pattern. The synchronization signal is provided to a memory storing reference data and including a memory controller generating memory addresses to output the reference data. The phase sync signal is provided to the detector and the comparator. The detector generates a first output signal in the form of a dynamic blanking signal in response to the detection of the blanking primitives in the parallel data. The detector generates a second output signal that is coupled to the memory controller for suppressing the generation of memory addresses from the memory controller during the occurrence of blanking primitives. The comparator receives the reference data from the memory and compares the reference data with the delayed parallel data to generate bit error outputs when the first output signal from the detector is absent and suppresses the generation bit error outputs when the first output signal is present.

The blanking primitive masking circuit may include a counter coupled to receive the first output signal from the detector and a clock signal for generating a count of consecutive blanking primitives as a function of the number of clocks during the consecutive blanking primitives. The output of the counter may be coupled to a register that stores the maximum count of consecutive blanking primitives. The clock may be a clock embedded in serial data received by the input circuitry wherein the input circuitry recovers the embedded clock and generates the parallel data having a selected number of parallel bits with the recovered clock being divided by a value equal to the selected number of parallel bits to generate the clock signal.

Logic circuitry in the comparator generate the bit error outputs when bits of the reference data corresponding to bits of the delayed data are mismatched and the first output signal from the detector is absent. The comparator also has logic circuitry that suppresses the bit error outputs when bits of the reference data corresponding to bits of the delayed data are mismatched and the first output signal from the detector is present. The comparator may also include circuitry, such as a NAND gate, receiving the bit error outputs and generating an error signal.

An error counter is preferably coupled to the comparator to receive the bit error outputs and may include circuitry for generating an error signal. The circuitry may be a NAND gate receiving the bit error outputs from the comparator.

The objects, advantages and novel features of the present invention are apparent from the following detailed description when read in conjunction with appended claims and attached drawings.

BRIEF DESCRIPTION OF THE DRAWING FIGURES

Figure 8:
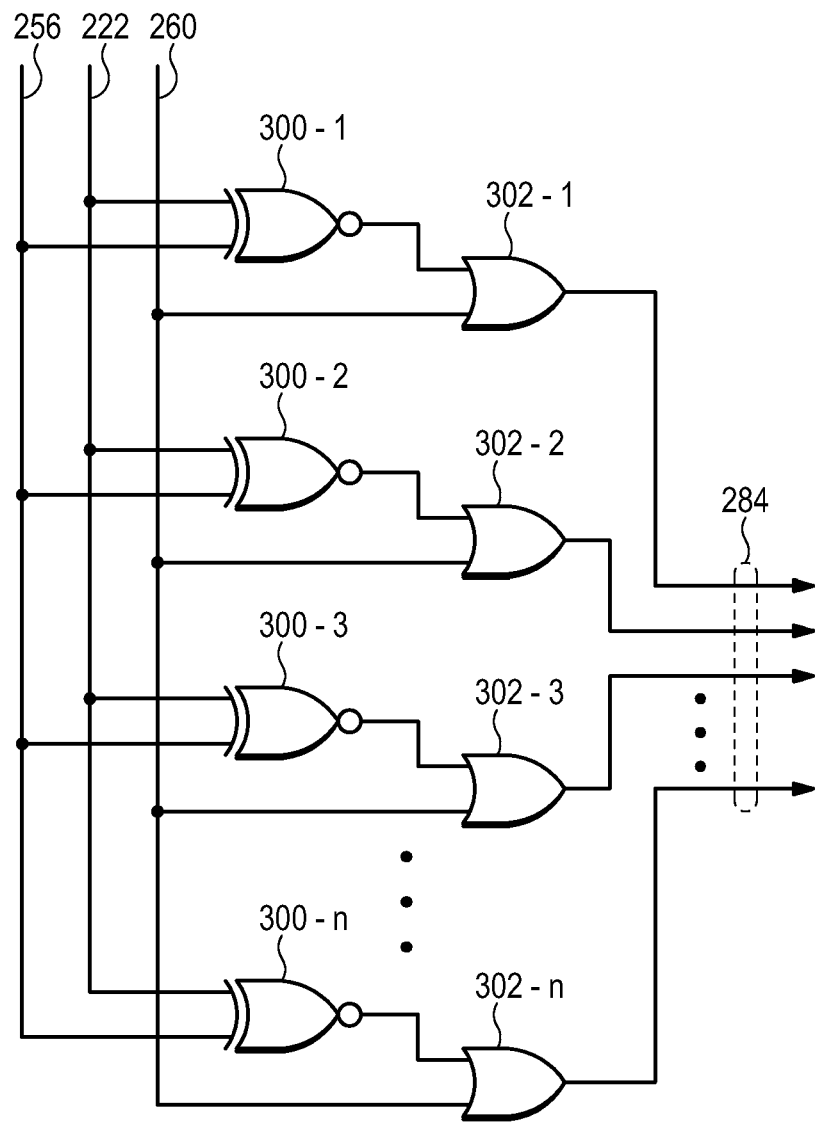

FIG. 8 there is shown a more detailed representation of internal comparators of a larger comparator used in blanking primitive masking circuit according to the present invention.

DESCRIPTION OF THE INVENTION

Figure 1:
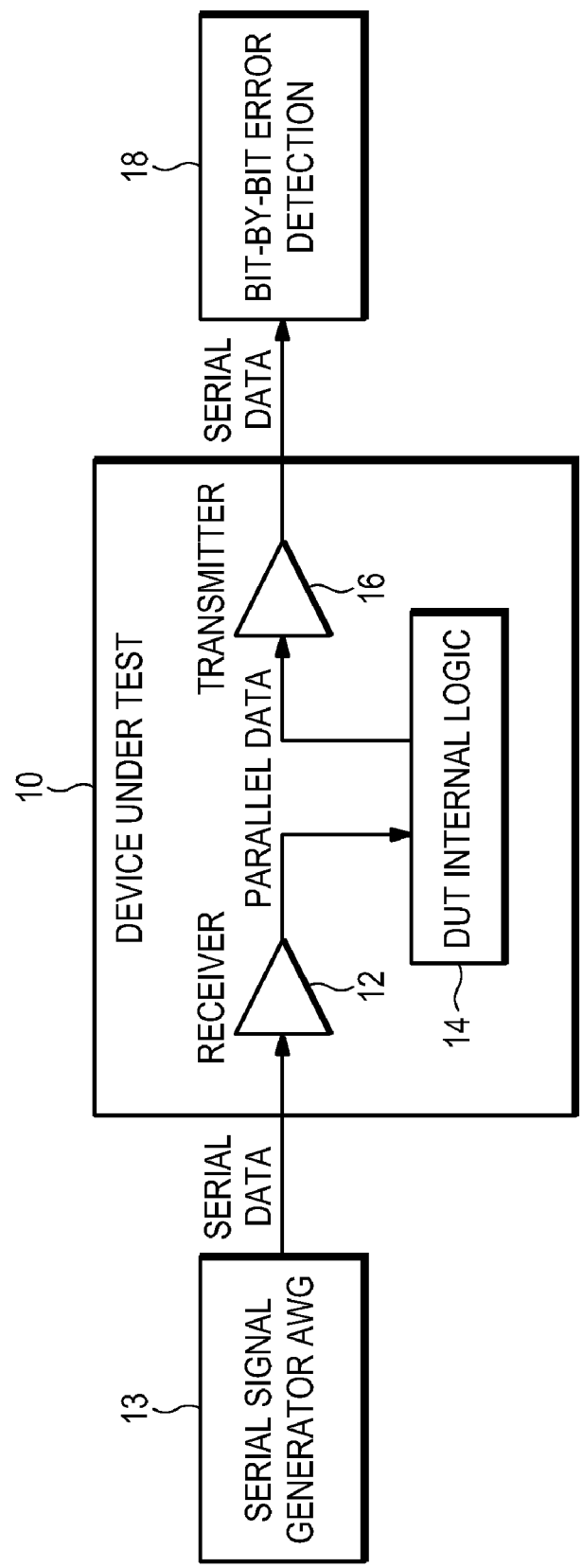
FIG. 1 illustrates digital retimed loop back mode configuration used in generating blanking primitives.

Referring to FIG. 1, there is shown a block diagram illustrating a device under test (DUT) 10 configured in a Digital Retimed Loop Back Mode. Serial data is provided to a receiver 12 in the DUT 10 by a signal generator 13. The DUT internal logic 14 converts the serial data to parallel data and processes the parallel data which is output to transmitter 16. The transmitter 16 converts the parallel data to serial data which is output from the DUT 10. A test and measurement instrument having bit-by-bit error detection 18 may be coupled to the DUT 10 output for detecting bit-by-bit errors in the serial data output. Many standards allow the host or the devices to randomly insert or delete a sequence of characters to keep the transmitting and receiving in alignment. For example, in SATA these sequences are called align primitives, and in PCI Express these sequences are called skip order set. In order to do the bit-by-bit error detection, these sequences have to be stripped off or appropriately ignored. In the following description, these sequences will be preferred as the blanking primitives. It should be noted that the number of blanking primitives can be different every time the DUT decides to insert or delete a blanking primitive and a sequence can be a single blacking primitive or multiple blanking primitives. The handling of the blanking primitives only applies when the DUT 10 is configured in Digital Retimed Loop Back Mode because it is only in this mode that the DUT can randomly inserts the blanking primitives.

Figure 2:
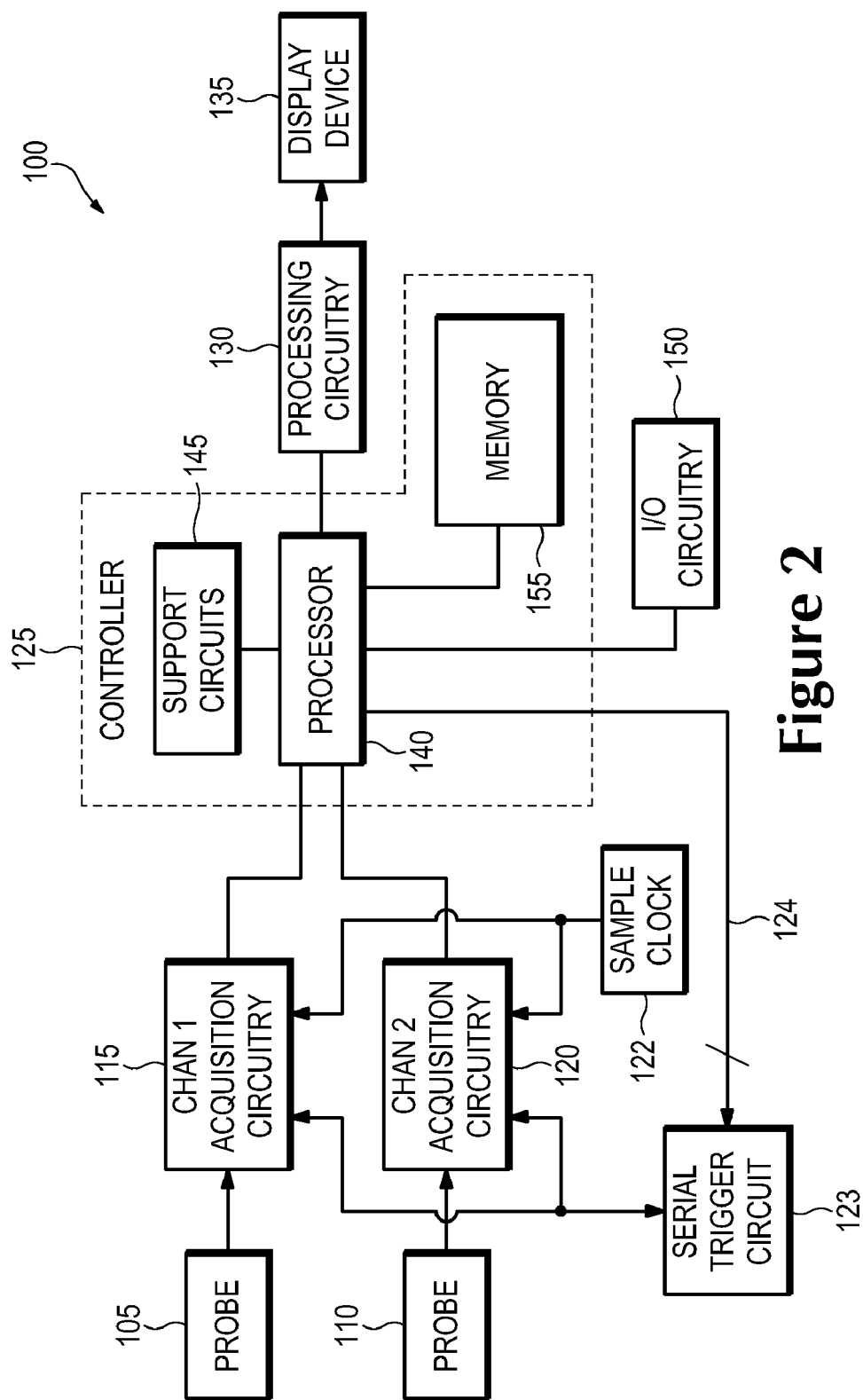
FIG. 2 is a block diagram of a digital oscilloscope incorporating a blanking primitive masking circuit according to the present invention.

The present invention is implemented in a test and measurement instrument, such as an oscilloscope, a logic analyzer, a network analyzer, or the like, and will be described below with respect to a digital oscilloscope. FIG. 2 depicts a high level block diagram of a digital oscilloscope 100 incorporating the subject invention. In particular, oscilloscope 100 has signal input channels, Channel 1 and Channel 2, with each channel having respective acquisition circuitry 115 and 120. The oscilloscope 100 also has a controller 125, processing circuitry 130, and a display device 135. Probes 105 and 110 are coupled to the signal input channels, Channel 1 and Channel 2, for coupling real time signal information to the oscilloscope. The probes 105 and 110 may be any conventional voltage or current probes suitable for respectively detecting analog voltage signals from a device under test (DUT) (not shown). Such probes are manufactured by Tektronix, Inc., Beaverton, Oreg. The number of signal channels in the oscilloscope 100 are by example only and the oscilloscope 100 may have more than two signal input channels and associated acquisition circuitry.

The Channel 1 acquisition circuitry 115 and Channel 2 acquisition circuitry 120 each include, illustratively, analog-to-digital conversion circuitry, triggering circuitry, decimator circuitry, supporting acquisition memory, and the like. Acquisition circuitry 115 and 120 operate to digitize, at a sample rate, one or more signals under test to produce one or more respective sample streams suitable for use by controller 125 or processing circuitry 130. Acquisition circuitry 115 and 120, in response to commands received from controller 125, change trigger conditions, decimator functions, and other acquisition related parameters. Acquisition circuitry 115, 120 communicates its respective resulting sample stream to controller 125.

A serial trigger circuit 123 is shown separate from an overall trigger system that may be part of the Channel 1 acquisition circuitry 115 and Channel 2 acquisition circuitry 120 for purposes of explanation. Serial trigger circuit 123 receives the real time sample stream signal acquired by, for example, channel 1 probe 105 and, for certain applications, receives an external clock signal acquired by, for example Channel 2 probe 110. Serial trigger circuit 123 receives control data input via a bus 124 from processor 140 of controller 125. The trigger circuit 123 includes circuitry for handling blanking primitives in bit-by-bit error detection which will be described in greater detail below.

Controller 125 operates to process one or more acquired sample streams provided by the acquisition circuitry 115 and 120 to generate respective sample stream data associated with one or more sample streams. That is, given desired time per division and volts per division display parameters, controller 125 operates to modify or rasterize the raw data associated with an acquired sample stream to produce corresponding waveform data having the desired time per division and volts per division parameters. Controller 125 may also normalize waveform data having non-desired time per division, volts per division, and current per division parameters to produce waveform data having the desired parameters. Controller 125 provides the waveform data to processing circuitry 130 for subsequent presentation on display device 135.

Processing circuitry 130 comprises data processing circuitry suitable for converting acquired sample streams or waveform data into image or video signals, which are adapted to provide visual imagery (e.g., video frame memory, display formatting and driver circuitry, and the like). Processing circuitry 130 may include display device 135 (e.g., a built-in display device) or provide output signals (e.g., via a video driver circuit) suitable for use by an external display device 135.

Controller 125 of FIG. 1 preferably comprises a processor 140, support circuits 145 and memory 155. Processor 140 cooperates with conventional support circuitry 145, such as power supplies, clock circuits, cache memory, and the like, as well as circuits that assist in executing software routines stored in memory 155. As such, it is contemplated that some of the process steps discussed herein as software processes may be implemented within hardware, for example, as circuitry that cooperates with Processor 140 to perform various steps. Controller 125 also interfaces with input/output (I/O) circuitry 150. For example, I/O circuitry 150 may comprise a keypad, pointing device, touch screen, or other means adapted to provide user input and output to controller 125. Controller 125, in response to such user input, adapts the operations of acquisition circuitry 115 and 120 to perform various data acquisitions, triggering, processing, and display communications, among other functions. In addition, the user input may be used to trigger automatic calibration functions or adapt other operating parameters of display device 135, logical analysis, or other data acquisition devices.

Memory 155 may include volatile memory, such as SRAM, DRAM, among other volatile memories. Memory 155 may also include non-volatile Memory devices, such as a disk drive or a tape medium, among others, or programmable memory, such as an EPROM, among others.

Although controller 125 of FIG. 1 is depicted as a general purpose computer that is programmed to perform various control functions in accordance with the present invention, the invention may be implemented in hardware such as, for example, an application specific integrated circuit (ASIC). As such, it is intended that processor 125, as described herein, be broadly interpreted as being equivalently performed by hardware, software, or by a combination thereof.

It will be appreciated by those skilled in the art that standard signal processing components (not shown), such as signal buffering circuitry, signal conditioning circuitry, and the like are also employed as required to enable the various functions described herein. For example, acquisition circuitry 115 and 120 sample the signals under test at a sufficiently high rate to enable appropriate processing by controller 125 or processing circuitry 130. In this regard, acquisition circuitry 115 and 120 sample their respective input signals in accordance with a sample clock provided by an internal sample clock generator 122.

Figure 3:
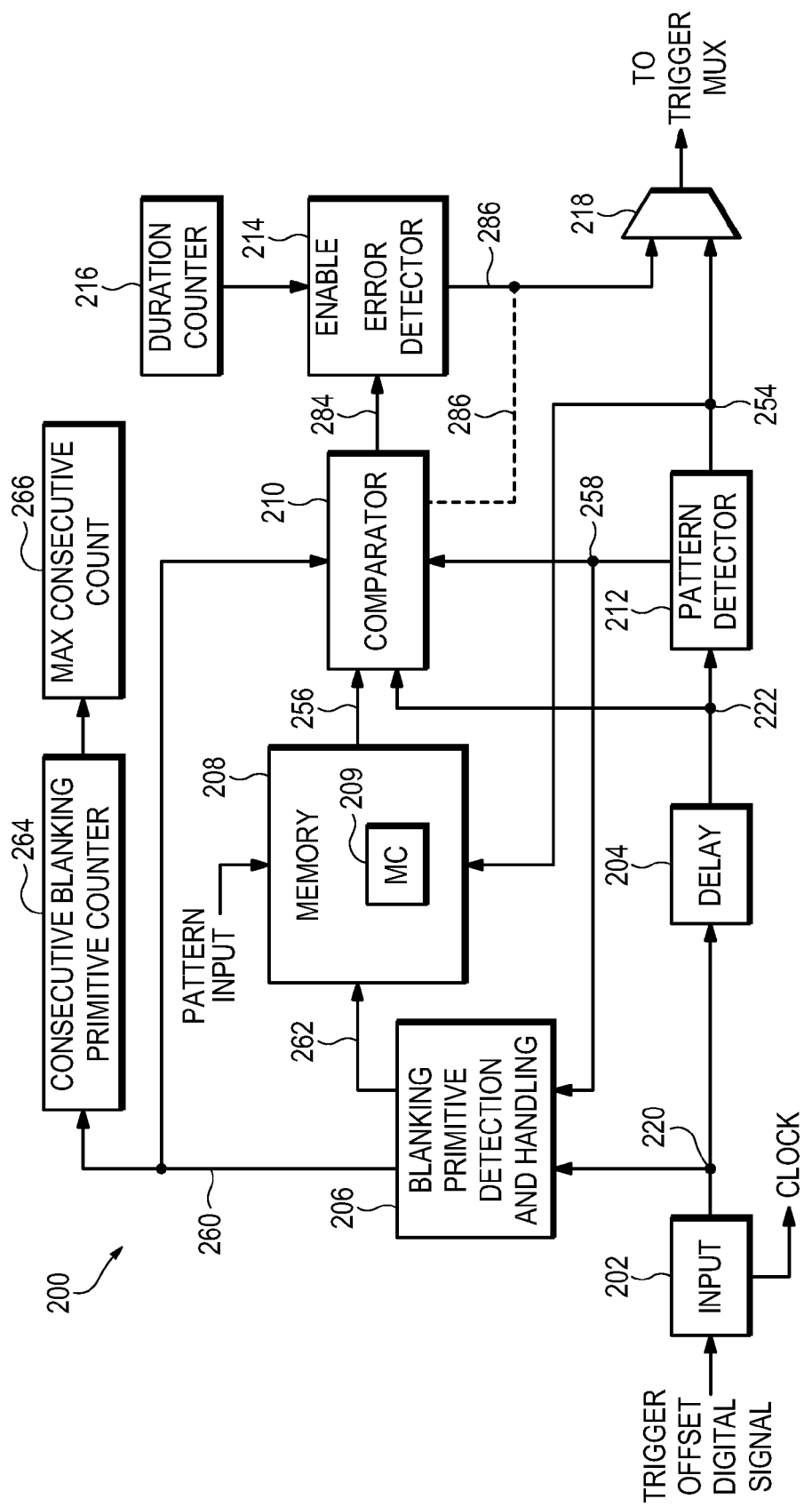
FIG. 3 is a block diagram of a bit-by-bit error detection circuit having a blanking primitive masking circuit according to the present invention.

FIG. 3 is a block diagram of a bit-by-bit error detection circuit 200 having a blanking primitive masking circuitry according to an embodiment of the present invention. Like elements from FIG. 2 are labeled the same in FIG. 3. The blanking primitive masking circuitry is preferably a part of the serial trigger circuit 123 and includes an input 202 having an output respectively coupled to a delay circuit 204 and a blanking primitive detection and handling circuit 206. The blanking primitive detection and handling circuit 206 has a first output coupled to comparator 210 and a consecutive blanking primitive counter 264 and a second output coupled to a memory 208. The output of memory 208 is also coupled to the comparator 210. The output of the delay circuit 204 is respectively coupled to a pattern detector 212 and the comparator 210. One output of the pattern detector 212 is respectively coupled to the blanking primitive detection and handling circuit 206 and the comparator 210. Another output of the pattern detector 212 is coupled to memory 208 and to an input of selector 218. Another input of the selector 218 may be coupled to comparator 210 or to an error counter 214. The error counter 214 is also coupled to receive the output from a duration counter 216.

The received analog signal from one of the probes 105 and 110 is coupled to a trigger level comparator (not shown) in the trigger circuit 123 in the oscilloscope 100. The trigger level comparator also receives a trigger level signal. The trigger level comparator produces a trigger level offset digital signal that is coupled to the input 202. In one embodiment, the received analog signal is a serial communications signal, such as Serial ATA, PCI Express, Fiber Channel, USB 3.0 or the like, having a known data pattern for executing receiver margin testing. In the below description of the invention, the data pattern consists of 8B/10B encoded data having a 40-bit pattern of 4 characters, labeled ABCD . . . . The input 202 is a receiver having a 40-bit serial to parallel architecture that delivers 40-bits (2 words of 2 characters each with each character having 10-bits) per clock. The 2 words, herein after called D-words, are coupled the input of the delay circuit 204 and the blanking primitive detection and handling circuit 206. The input 202 includes clock recovery circuitry that recovers a clock signal in the trigger level offset digital signal derived from the received analog signal. The clock signal is divided down by the bit count of the D-words (40 in this example) and provided to the other functional blocks of the bit-by-bit error detection circuit 200 and blanking primitive masking circuitry for synchronization of the functional blocks.

The delay circuit 204 delays the 40-bit D-words 220 by a selected number of clock cycles. In the preferred embodiment, the 40-bit D-words 220 are delayed by 10 clock cycles. It should be noted that other delay values may be used and that such delay values may be dynamically changed. The delayed 40-bit D-words 222 are provided to the comparator 210 and the pattern detector 212

Figures 4, 5:
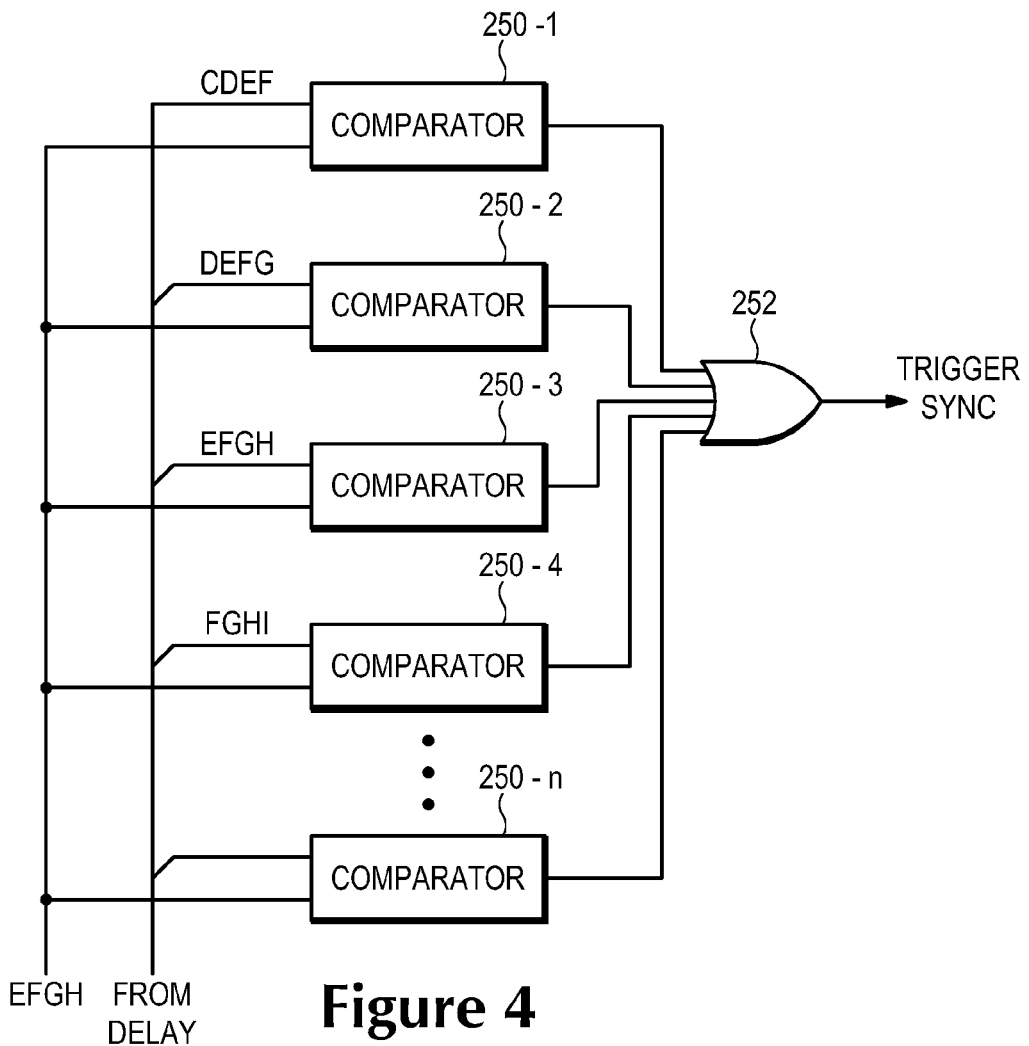
FIG. 4 is a simplified diagram of the pattern detector used with the blanking primitive masking circuit according to the present invention.
FIG. 5 is a table showing a delayed 40-bit D-word pattern sequence used in blanking primitive masking circuit according to the present invention.

The pattern detector 212 is provided with comparators for detecting a selected D-word pattern from the received delayed 40-bit D-words 222. Referring to FIG. 4, there is shown a simplified diagram of the pattern detector 212. The delayed 40-bit D-words 222 are provided to a series of comparators 250-1, 250-2, 250-3, 250-4 . . . 250-n with each comparator 250-1, 250-2, 250-3, 250-4 . . . 250-n receiving a D-word that is offset by one character. For example, 40-bit D-words 220 are in a pattern of ABCD EFGH IJKL where the sequence of four letters represents a D-word. The trigger offset digital signal to the input 202 generally will not start at the beginning of the pattern. In the example of FIG. 4, the pattern starts at character "C". A reference pattern, in this example "EFGH" is provided to the pattern detector 212 based on user input and is provided to each of the comparators 250. Each comparator 250-1, 250-2, 250-3, 250-4 . . . 250-n receives a D-word with the first comparator 250-1 receiving the D-word "CDEF". Comparator 250-2 receives a D-word shifted by one character from the initial character "C" resulting in the D-word "DEFG". Comparator 250-3 receives a D-word shifted by 2 characters from the initial starting character "C" resulting in a D-word "EFGH". Comparator 250-4 receives a D-word shifted by 3 characters from the initial starting character "C" resulting in a D-word "FGHI". Additional comparators 250 are provided in the pattern detector 212 to provide sufficient offsets for 4 character D-words (i.e. 7 comparators).

Each comparator 250-1, 250-2, 250-3, 250-4 . . . 250-n has 40 parallel EXCLUSIVE-NOR gates with each EXCLUSIVE-NOR gate receiving a bit from the reference pattern "EFGH" and a bit from delayed 40-bit D-word. The outputs of the 40 parallel EXCLUSIVE-NOR gates are applied to the inputs of an AND gate. The output of the AND gates are coupled to an OR gate 252. All of the outputs of the EXCLUSIVE-NOR gates of one of the comparators 250-1, 250-2, 250-3, 250-4 . . . 250-n are required to be a logical high to indicate a match between the reference pattern and 40-bit D-word applied to that comparator. The logical highs on the inputs of the AND gate produces a logical high that is coupled to the input of OR gate 252. A logical high applied to any of the inputs of the OR gate 252 generates a logical high 254 at the output of the OR gate. The logical high output 254 of the OR gate is provided to the selector 218 as a trigger output pulse and to the memory 208 as a synchronization signal.

The memory 208 stores reference digitized data that may be user selected industry standard patterns for receiver margin test solutions. The memory 208 can be any variety of memory. For example, the memory 208 can be dynamic memory, static memory, read-only memory, random-access memory, or the like. The memory 208 can be configured to store reference digitized data including a reference sequence. For example, the reference digitized data can be a user-defined pattern, an industry standard pattern, or the like. The reference sequence can be any sequence of data that is unique within the entire repeated pattern. In another example, the reference digitized data can be a pseudorandom bit sequence. The reference sequence can be a particular series of ones or a series of zeros appropriate for the length of the pseudorandom pattern. Accordingly, as will be described below, the reference digitized data can be compared with the delayed 40-bit D-words to detect errors in the received analog signal.

The memory 208 can include a memory controller 209. The memory controller 209 can be configured to cause the memory 208 to output the reference digitized data 256 in response to the synchronization signal 254 and an address signal from the blanking primitive detection and handling circuit 206. In an embodiment, the memory controller 209 can be integrated with the memory 208. However, in another embodiment, the memory controller 209 can be separate from the memory 208. For example, the memory controller 209 can be part of a control system of the oscilloscope 100.

The memory 208 in response to the synchronization signal 254 can be configured to output the reference digitized data 256. The output reference digitized data 256 can be aligned appropriately to the delayed 40-bit D-words 222 such that the reference digitized data 256 that is output to the comparator 210 can be the data that is expected in the delayed 40-bit D-words 222. Although the reference sequence can be what generated the synchronization signal 254, the reference sequence can, but need not be the beginning of the reference digitized data 256 output from the memory 208. For example, an amount of time may have passed since the recognition of the reference sequence. The output of the reference digitized data 256 can be controlled appropriately such that even though the reference sequence is no longer present in the delayed 40-bit D-words 222, the appropriate reference digitized data 256 is output corresponding to the current expected digitized data delayed 40-bit D-words 222. In an embodiment, the synchronization signal 254 can reflect such an offset.

Referring to FIG. 5, there is shown a table representing the delayed 40-bit D-word pattern. The delayed pattern D-word "EFGH" matching the reference pattern trigger sequence "EFGH" is offset two characters from the start of the delayed 40-bit D-word pattern sequence. This offset represents a phase difference between the initial start of the delay 40-bit D-word pattern sequence at character "C" and the start of the delayed 40-bit D-word at character "E" matching the reference pattern trigger sequence "EFGH". This phase difference needs to be offset in the blanking primitive masking circuitry. The pattern detector 212 generates a two bit phase sync signal 258 that is coupled to the comparator 210 and the blanking primitive detection and handling circuit 206. The phase sync signal 258 provides information on the amount of offset (phase difference) from the start of an acquisition to the start of the pattern trigger sequence.

Figures 6, 7:
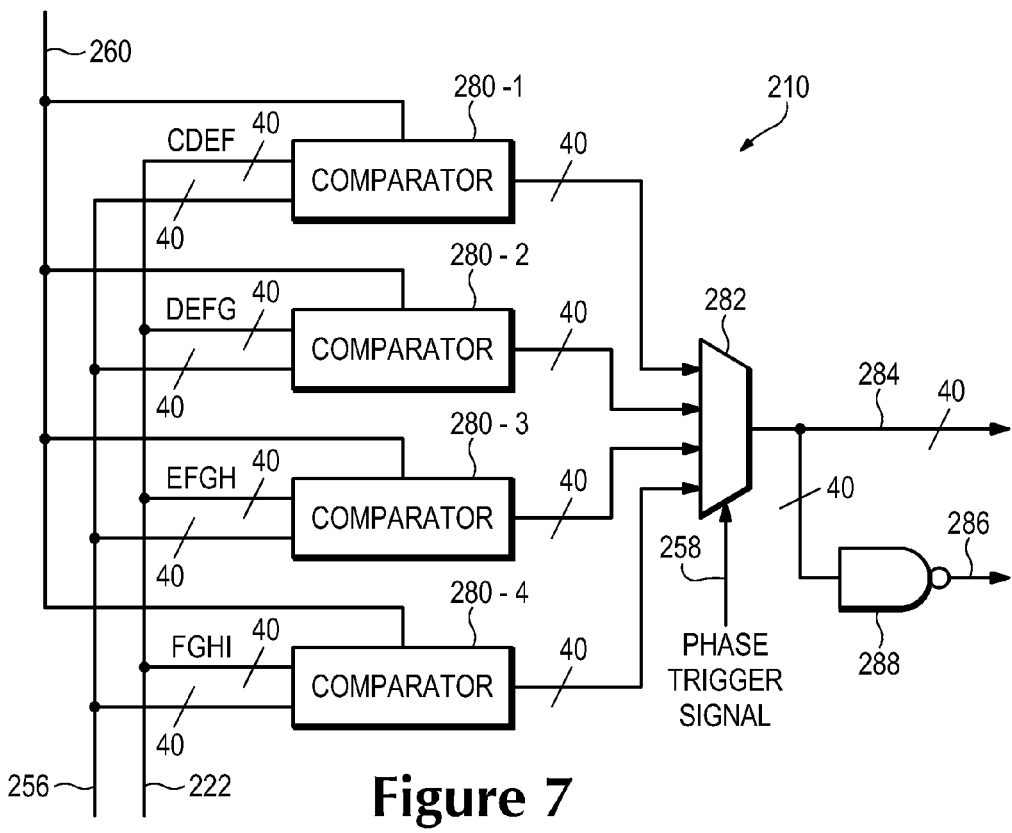
FIG. 6 is a table showing a 40-bit D-word pattern sequence with the addition of blanking primitives used in blanking primitive masking circuit according to the present invention.
FIG. 7 is a block diagram showing internal components of a comparator used in blanking primitive masking circuit according to the present invention.

The blanking primitive detection and handling circuit 206 receives the 40-bit D-words from the input 202. The blanking primitive detection and handling circuit 206 monitors the 40-bit D-words for the presence of blanking primitives added by the DUT 10. The blanking primitive detection and handling circuit 206, in conjunction with the phase sync signal 258 generates a dynamic blanking signal 260 when blanking primitives are detected. FIG. 6 is a table showing the 40-bit D-word pattern sequence as shown in FIG. 5 with the addition of blanking primitives BP0, BP1, BP2 and BP3. The dynamic blanking signal 260 is coupled to the comparator 210 for suppressing the blanking primitives that are input to the comparator 210 in the delayed 40-bit D-words 222. The blanking primitive detection and handling circuit 206 also generates a stop address signal 262 that is applied to the memory control 209 in response to the detected blanking primitives to suspend the generation of memory addresses in the memory control 209. The suspending of the memory address generation prevents the memory 208 from providing new reference digitized data 256 to the comparator 210 during the presence of the blanking primitives.

Referring to FIG. 7, there is shown a block diagram of the internal components of the comparator 210. The comparator 210 has multiple individual comparators 280-1, 280-2, 280-3, 280-4 with each comparator 280-1, 280-2, 280-3, 280-4 configured to receive the reference digitized data 256 from memory 208, a subset of the delayed 40-bit D-words 222 from the delay 204, the dynamic blanking signal 260 and the phase sync signal. For example, subsets CDEF, DEFG, and EFGH represent different portions of the delayed 40-bit D-words 222. The comparator 210 is configured to compare bits of the reference digitized data 256 to bits of the delayed 40-bit D-words 222 in parallel. The comparison can be performed in a variety of ways. In an embodiment, the comparator 210 can be configured to compare bits of the reference digitized data 256 to bits of the delayed 40-bit D-words 222 in parallel. The output of each comparator 280-1, 280-2, 280-3, 280-4 is parallel data indicating whether the associated bit of the delayed 40-bit D-words 222 matches the reference digitized data 256.

The outputs of the comparators 280-1, 280-2, 280-3, 280-4 are coupled to a selector 282. The selector 282 is configured to select the matching reference digitized data 256 and the subset of the delayed 40-bit D-words from among the outputs of the comparators 280-1, 280-2, 280-3 280-4 using the phase sync signal 258 to generate a bit error output 284 from the comparator 210. Thus, the selected comparison can occur in any of multiple positions relative to the delayed 40-bit D-words 222. Although the output of the reference digitized data 256 has been described above as being aligned to the expected delayed 40-bit D-words 222 at the comparator 212, the granularity of blocks of the delayed 40-bit D-words 222 can result in the reference sequence spanning portions of the delayed 40-bit D-words 222 that are not presented at the same time. The bit error output 284 of the selector 282 is coupled to the input of the error counter 214 and to a NAND gate 288. The NAND gate 288 generates an error signal 286 that is coupled to the selector 218. The positioning of the NAND gate 288 in the comparator 210 is by example only. The NAND gate 288 may also be positioned in the error counter 214 with the resulting error signal 286 being provided from the error counter 214.

Referring to FIG. 8, there is shown a more detailed representation of the comparators 280-1, 280-2, 280-3, 280-4. Each comparator has a set of parallel EXCLUSIVE-NOR gates 300-1, 300-2, 300-3 . . . 300-$n$. The outputs of the EXCLUSIVE-NOR gates 300-1, 300-2, 300-3 . . . 300-$n$ are coupled to one input of corresponding OR gates 302-1, 302-2, 302-3 . . . 302-$n$. Each EXCLUSIVE-NOR gate receives one bit of 40-bit D-words of the reference digitized data 256 and one bit of the subset of the delayed 40-bit D-words 222. If the bits at the inputs of each EXCLUSIVE-NOR gate match, then a logical high will be provided to one input of the corresponding OR gate 302-1, 302-2, 302-3 . . . 302-$n$. If the bits at the inputs of each EXCLUSIVE-NOR gate do not match, then a logical low will be provided to one input of the corresponding OR gate 302-1, 302-2, 302-3 . . . 302-$n$. Each OR gate 302-1, 302-2, 302-3 . . . 302-$n$ is also coupled to receive the dynamic blanking signal 260 from the blanking primitive detection and handling circuit 206. The dynamic blanking signal 260 is a logical low when blanking primitives are not present and a logical high when the blanking primitives are present. The logic outputs from the EXCLUSIVE-NOR gates 300-1, 300-2, 300-3 . . . 300-$n$ are logical highs when the bits of the subset of the delayed 40-bit D-words 222 and the bits of the reference digitized data match and logical lows when the bits of the subset of the delayed 40-bit D-words 222 and the bits of the reference digitized data do not match. When the dynamic blanking signal 260 is low, the outputs of the OR gates 302-1, 302-2, 302-3 . . . 302-$n$ are the same as the outputs of the corresponding EXCLUSIVE-NOR gates 300-1, 300-2, 300-3 . . . 300-$n$. When the delayed 40-bit D-words 222 have blanking primitives, the outputs of the EXCLUSIVE-NOR gates 300-1, 300-2, 300-3 . . . 300-$n$ may be either a logical high or a logical low depending on whether the logic level of the bits of the blanking primitive match the bits of the pattern data prior to the blanking primitive. As previously states, the presence of a blanking primitive causes the memory controller 209 to suspend the generation of memory addresses resulting in the last pattern data output from the memory 208 to be at the input of the comparator 210. In the presence of blanking primitives, the dynamic blanking signal 260 is a logical high. The logical high dynamic blanking signal 260 forces the outputs of the OR gates 302-1, 302-2, 302-3 . . . 302-$n$ to logical highs. Forcing the outputs of the OR gates 302-1, 302-2, 302-3 . . . 302-$n$ to logical highs prevents the error detector 214 from counting any of the bits of the blanking primitive as a bit-error.

The outputs of the OR gates 302-1, 302-2, 302-3 . . . 302-$n$ are coupled via the selector 282 to the error counter 214. The error counter 214 may include includes circuitry, such as the multi-input NAND gate 288 previously described, that receives the bit error outputs from the selector 282 and generates a logical low when the bits of the subset of the delayed 40-bit D-words input 222 and the bits of the reference digitized data 256 to each of the EXCLUSIVE-NOR gates 300-1, 300-2, 300-3 . . . 300-$n$ of the selected comparator 280-1, 280-2, 280-3, 280-$n$ match or when the dynamic blanking signal is present. The NAND gate 288 produces a logical high when one of the bits of the subset of the delayed 40-bit D-words input 222 and one of the bits of the reference digitized data 256 to each of the EXCLUSIVE-NOR gates 300-1, 300-2, 300-3 . . . 300-*n* of the selected comparator 280-1, 280-2, 280-3, 280-4 do not match and the dynamic blanking signal 260 is not present. Additional circuitry in the error counter 214 can be configured to perform various analyses of the 40-bit D-word output 284. For example, as will be described in further detail below, the error counter 214 can be configured to indicate if any bit has an error, count the number of errors, indicate a location of one or more error bits, indicate an error rate, or the like.

A properly functioning receiver DUT 10 is designed to have a maximum number of consecutive blanking primitives. If the maximum number of consecutive blanking primitives is exceeded, then it is an indication that the DUT 10 is not functioning properly. The present invention includes a consecutive blanking primitive counter 264 that is coupled to receive the dynamic blanking signal 260 from the blanking primitive detection and handling circuit 206 and the clock from the input 202. The consecutive blanking primitive counter 264 uses the clock to count the continuous occurrences of the blanking primitives present in the trigger level offset digital signal derived from the received analog signal. The consecutive blanking primitive counter 264 is reset to zero at an occurrence of a non-blanking primitive D-word. The maximum count of the continuous occurrences of the blanking primitives is stored in a maximum consecutive blanking primitive register 266. The maximum continuous blanking primitive count is preferably displayed on display device 135 of the digital oscilloscope 100.

Moreover, the oscilloscope 100 can include a duration counter 216 coupled to the error counter 214. The duration counter 216 can be configured to reset the error counter 214, enable the error counter 214, or the like. The duration counter 216 can also be configured to output a time duration. For example, the duration counter 216 may be enabled for a specific amount of time. Alternately, the duration counter 216 may be enabled for an infinite amount of time. Accordingly, the elapsed time can be used to calculate error rates, gate the error detection over a time period, or the like.

In another embodiment, the duration counter 216 can be configured to count a number of elapsed bits. In another embodiment, the duration counter 216 can be configured to receive a clock signal associated with the 40-bit D-words 220. Thus, the duration counter 216 can determine the number of elapsed bits. Accordingly, error rates such as errored bits per elapsed bits can be calculated.

Furthermore, the duration counter 216 can be configured to measure any span associated with the 40-bit D-words 220. That is, as described above, time and number of bits can be used in the analysis of errors. However, other factors can be used, such as number of frames, number of code words, or the like.

The error signal 286 and the trigger output pulse 254 are input to the selector 218. The selector 218 can be configured to select from among the error signal 286, the trigger out pulse 254, and a number of other trigger events for input to the trigger MUX. Although the trigger out pulse 254 from the pattern detector 212 and the error signal 286 has been described as being input to the selector 218, the trigger out pulse 254 and/or the error signal 286 can be supplied to the trigger system without selection from among other triggering signals.

Accordingly, as the error signal 286 is available to the trigger system, an acquisition of the oscilloscope 100 can be triggered in response to the error signal 286 For example, an acquisition can be triggered on a single error, on a number of errors, on an error in a particular location within the 40-bit D-words 220, or the like. As a result, a user can focus attention on the errored portion of the 40-bit D-words 220.

While the present invention has been described using an oscilloscope, it is understood that the presenting invention may be implemented on other types of test and measurement instruments. Further, while the invention has been described in relation to a specific data structure and data standard, it should be recognized that the invention may be implements using other types of data structures and data standards.

It will be obvious to those having skill in the art that many changes may be made to the details of the above-described embodiments of this invention without departing from the underlying principles thereof. The scope of the present invention should, therefore, be determined only by the following claims.

What is claimed is:

1. A blanking primitive masking circuit comprising:
   a memory storing reference data and including a memory controller generating memory addresses to output the reference data;
   a delay circuit receiving parallel data having blanking primitives and generating delayed parallel data;
   a pattern detector receiving the delayed parallel data and a selected data pattern and generating a synchronization signal in response to the detection of the selected data pattern in the delayed parallel data and a phase sync signal representative of a phase difference between the delayed parallel data and the selected data pattern;
   a detector receiving the parallel data and the phase sync signal and detecting occurrences of the blanking primitives in the parallel data with the detector generating a first output signal for suppressing the detected blanking primitives and a second output signal coupled to the memory for suppressing the generation of memory addresses from the memory controller during the occurrence of blanking primitives; and
   a comparator receiving the reference data from the memory, the delayed parallel data from the delay circuit, the phase sync signal, and the first output signal from the detector and generating bit error outputs when the first output signal from the detector indicates the absence of blanking primitives in the parallel data and suppressing the generation of bit error outputs when the first output signal indicates the presence of blanking primitives in the parallel data.

2. The blanking primitive masking circuit as recited in claim 1 further comprising a counter coupled to receive the first output signal from the detector and a clock signal and generate a count of consecutive blanking primitives as a function of a number of clocks during the consecutive blanking primitives.

3. The blanking primitive masking circuit as recited in claim 2 further comprising a register receiving the count from the counter and storing a maximum count of consecutive blanking primitives.

4. The blanking primitive masking circuit as recited in claim 1 further comprising an input receiving serial digital data having an embedded clock signal and recovering the embedded clock signal and generating the parallel data having a selected number of parallel bits and a clock signal derived from the recovered clock signal divided by a value equal to the selected number of parallel bits.

5. The blanking primitive masking circuit as recited in claim 1 wherein the comparator further comprises a plurality of comparators with each comparator receiving the reference data, a subset of the delayed parallel data, and the first output signal from the detector and generating the bit error outputs when bits of the reference data and the bits of the delayed parallel data are mismatched.

6. The blanking primitive masking circuit as recited in claim 5 wherein the comparator further comprises a selector receiving the bit error outputs from the plurality of comparators and the phase sync signal for selectively outputting the bit error outputs from the comparator of the plurality of comparators corresponding to the phase difference between the delayed parallel data and the selected data pattern.

7. The blanking primitive masking circuit as recited in claim 5 wherein each comparator of the plurality of comparator comprises logic circuitry receiving the reference data, the delayed parallel data, and the first output signal of the detector and generating the bit error outputs when bits of the reference data corresponding to bits of the delayed data are mismatched and the first output signal from the detector indicates the absence of blanking primitives in the parallel data.

8. The blanking primitive masking circuit as recited in claim 5 wherein each comparator of the plurality of comparators comprises logic circuitry receiving the reference data, the delayed parallel data, and the first output signal of the detector and suppressing the bit error outputs when bits of the reference data corresponding to bits of the delayed data are mismatched and the first output signal from the detector indicates the presence of blanking primitives in the parallel data.

9. The blanking primitive masking circuit as recited in claim 6 wherein the comparator further comprises circuitry receiving the bit error outputs from the selector and generating an error signal.

10. The blanking primitive masking circuit as recited in claim 9 wherein the circuitry receiving the bit error outputs is a NAND gate.

11. The blanking primitive masking circuit as recited in claim 6 further comprising an error counter receiving the bit error outputs from the selector and generating an error signal.

12. The blanking primitive masking circuit as recited in claim 11 wherein the error counter comprises a NAND gate receiving the bit error outputs.

* * * * *